(12) United States Patent
Aridas et al.

(10) Patent No.: US 7,342,445 B2
(45) Date of Patent: Mar. 11, 2008

(54) RADIO FREQUENCY POWER AMPLIFIER CIRCUIT AND METHOD

(75) Inventors: Narendra Kumar Aridas, Kulim (MY); Macwien Krishnamurthi Annamalai, Petaling Jaya (MY); Joshua Khai Ho Lee, Penang (MY); Teik Siew Tan, Pul (MY)

(73) Assignee: Motorola, Inc., Schaumburg, IL (US)

( * ) Notice: Subject to any disclaimer, the term of this patent is extended or adjusted under 35 U.S.C. 154(b) by 84 days.

(21) Appl. No.: 11/420,831

(22) Filed: May 30, 2006

(65) Prior Publication Data

US 2008/0012637 A1 Jan. 17, 2008

(51) Int. Cl.
*H03G 3/20* (2006.01)

(52) U.S. Cl. .................. 330/129; 330/133; 330/96; 330/85

(58) Field of Classification Search .............. 330/129, 330/133, 96, 85
See application file for complete search history.

(56) References Cited

U.S. PATENT DOCUMENTS 5,003,270 A * 3/1991 Braathen et al. ............ 330/279
5,977,831 A * 11/1999 Davis et al. ................. 330/279
6,525,873 B2 * 2/2003 Gerrish et al. ............ 359/341.4
6,580,901 B1 * 6/2003 Mochizuki ................ 455/127.1
7,009,449 B2 * 3/2006 Habring et al. ............. 330/254
7,103,029 B1 * 9/2006 Minowa ..................... 370/342

* cited by examiner

Primary Examiner—Patricia Nguyen
(74) Attorney, Agent, or Firm—Terri S. Hughes

(57) ABSTRACT

A method (200) and radio frequency amplifier circuit (100) for adjusting a gain setting of a power amplifier (102) and a gain setting of a power amplifier driver (106) that form part of the radio frequency amplifier circuit (100). The method (200) includes selecting (220) a power output value for the power amplifier and an associated constant envelope modulated radio frequency signal supplied by the power amplifier driver (106) to the power amplifier (102) and then sensing variations (240) in a power output value of the power amplifier (102). Next there is performed adjusting (250) both the gain setting of the power amplifier (102) and adjusting the gain setting of the power amplifier driver (106) in response to the sensing so that the constant envelope modulated signal is within a linear operating region of the power amplifier (102). The gain settings of the power amplifier (102) and power amplifier driver (106) are concurrently adjusted until the power output value for the power amplifier is achieved.

15 Claims, 3 Drawing Sheets

RADIO FREQUENCY POWER AMPLIFIER CIRCUIT AND METHOD

FIELD OF THE INVENTION

The present invention relates generally to a radio frequency power amplifier circuit and method. In particular, the present invention relates to a radio frequency power amplifier circuit for constant envelope modulation and a method for adjusting a gain settings of a power amplifier and a gain setting of a power amplifier driver that form part of the radio frequency amplifier.

BACKGROUND

During operation of a power amplifier circuit comprising a Radio Frequency (RF) power amplifier, it is desirable to achieve relatively high amplifier efficiency across desired power levels (power modes). However, when considering a constant envelope modulated RF signal supplied to such a power amplifier circuit, the signal provided to the power amplifier can vary due to varying operating conditions of the circuit (i.e. temperature and supply voltage). Furthermore, with varying power level requirement from the power amplifier, suitable operating efficiency cannot be readily achieved. For any required operating power level, drain supply and the amplitude of the constant envelope modulated radio frequency signal at an amplifier input must be carefully selected and ideally maintained during circuit operation.

BRIEF DESCRIPTION OF THE FIGURES

In order that the invention may be readily understood and put into practical effect, reference will now be made to an exemplary embodiment as illustrated with reference to the accompanying figures, where like reference numerals refer to identical or functionally similar elements throughout the separate views. The figures together with a detailed description below, are incorporated in and from part of the specification, and serve to further illustrate the embodiments and explain various principles and advantages, in accordance with the present invention where.

Figure 1:
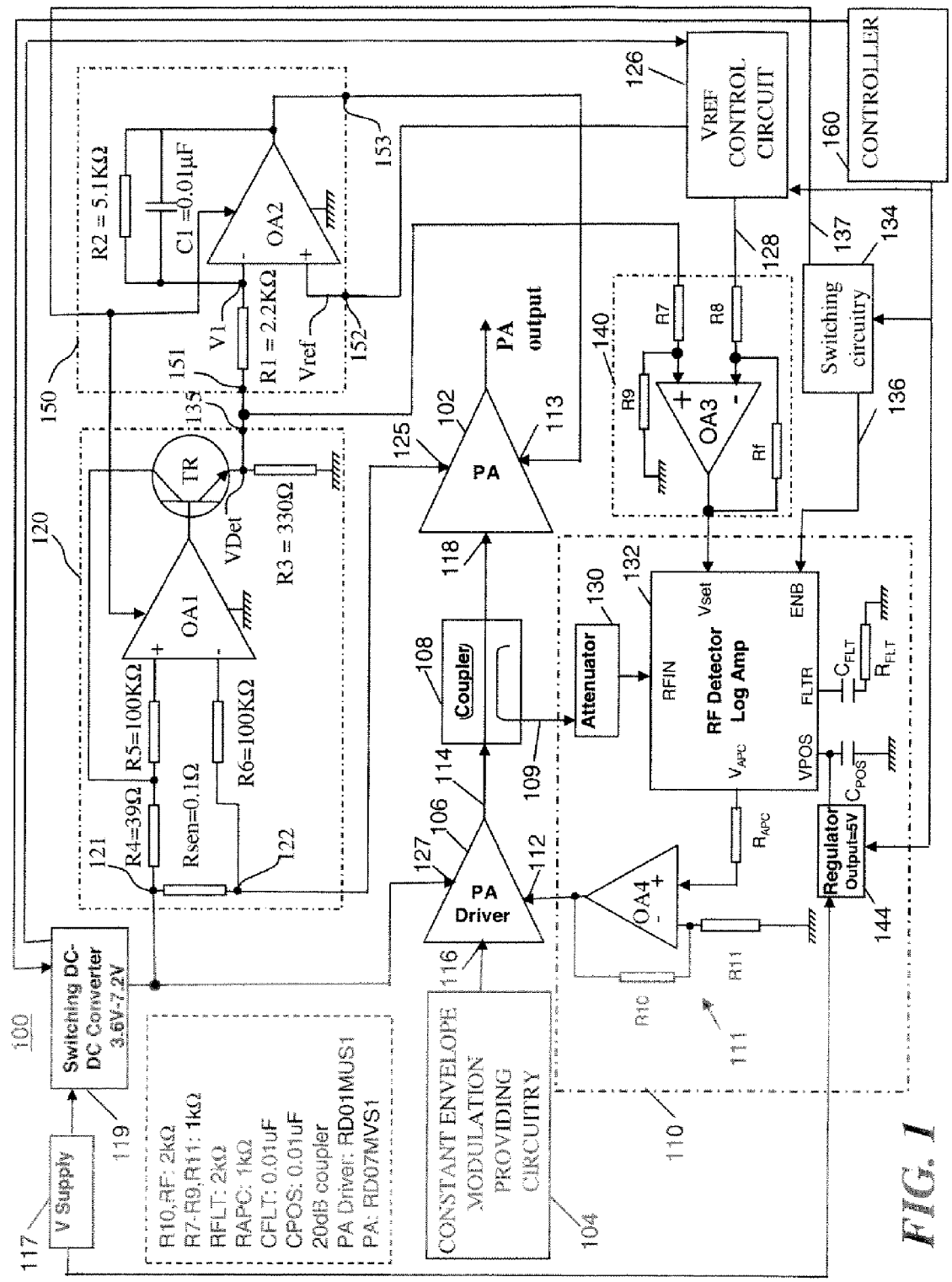
FIG. 1 is a block diagram of a radio frequency power amplifier circuit in accordance with an exemplary embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combination of method steps and apparatus components relating to a radio frequency power amplifier circuit for a constant envelope modulated signal to substantially maintain the amplified signal at a constant predefined amplitude. Accordingly, the apparatus components and method steps have been represented by conventional symbols in the drawings, showing only those specific details that are pertinent to understand the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Referring to FIG. 1, there is illustrated a radio frequency power amplifier circuit 100, that effectively operates as a constant envelope modulated radio frequency amplifier. The radio frequency power amplifier circuit 100 includes a power amplifier 102, a constant envelope modulation providing circuitry 104, a power amplifier driver 106, an amplifier input signal sensor 108 in the form of a coupler, a feedback circuit 110, an amplifier output power sensor 120 and a power amplifier gain controller 150. The constant envelope modulation providing circuitry 104 is typically either a frequency modulation circuit providing a frequency modulated signal or a frequency shift key modulation circuit providing a frequency shift key modulated signal.

The power amplifier driver 106 has a driver gain control input 112, a driver signal output 114, and a driver signal input 116 coupled to the constant envelope modulation providing circuitry 104. The power amplifier 102 has an amplifier input 118 that is coupled to the driver signal output 114 through the amplifier input signal sensor 108. The amplifier input signal sensor 108 has a signal sensor output 109 coupled a radio frequency signal input (RFIN) of the feedback circuit 110 and a direct current feedback circuit output (VAPC) of the feedback circuit 110 is coupled to the driver gain control input 112 by gain buffer circuitry 111.

The radio frequency power amplifier circuit 100 further includes a supply voltage power source 117 supplying a Direct Current (DC) Voltage to a DC voltage converter 119 that has a supply voltage output coupled to respective voltage supply inputs 125, 127 of the power amplifier 102 and power amplifier driver 106. The output of the DC voltage converter 119 is also coupled to a voltage reference control circuit 126. The voltage reference control circuit 126 has a reference control output 128 coupled, by a resistor R8, to an inverting reference input of an Operational amplifier OA3. The Operational amplifier OA3 has an output coupled to a reference in put (Vset) of a logarithmic amplifier 132 comprising part of the feedback circuit 110. There is also a feedback resistor Rf coupling the output of Operational amplifier OA3 to its inverting output and its non-inverting input is coupled to: a) ground by a pull down resistor R9; and b) to a power variation detector output 135 (VDet) of the amplifier output power sensor 120 by a resistor R7. As will be apparent to a person skilled in the art, the coupling arrangement of the Operational amplifier OA3 and resistors Rf, R7, R8, R9 form a differential amplifier 129. The Operational amplifier OA3, and associated resistors Rf, R7, R8 and R9 form a buffer or linear amplifier 140 as will be apparent to a person skilled in the art.

In addition to the reference control output 128. The voltage reference control circuit 126 also has a gain controller voltage reference output 149 coupled to a second input 152 of the power amplifier gain controller 150. Further, the voltage level provided at the reference control output 128 and gain controller voltage reference output 149 are selected depending upon the supply voltage of the voltage supply input 125 to the power amplifier 102 from the DC voltage converter 119.

The feedback 110 includes an attenuator 130 couples the signal sensor output 109 of amplifier input signal sensor 108 to the radio frequency signal input (RFIN) of the logarithmic amplifier 132. The logarithmic amplifier 132 used in the present case is typically an AD8315, which has a selected slope of 23 mV/dB and a suitable dynamic range of 50 dB. The attenuator 130 is typically a Pi network that is suitably tuned in order to fit into the log conformance region of the logarithmic amplifier 132.

The amplifier output power sensor 120 in this embodiment is a current to voltage converter including the power variation detector output 135 and converter inputs 121,122. The converter inputs 121,122 are coupled to opposite sides of the current sensing resistor Rsen and the current sensing resistor Rsen couples a supply voltage output (provided by the DC voltage converter 119) to voltage supply input 125. As will be apparent to a person skill in the art, the converter inputs 121,122 are at different potentials when current flows into the voltage supply inputs 125,127 through the current sensing resistor Rsen. More specifically, the input 122 is directly coupled to the voltage supply input 125 and input 121 is directly coupled to supply voltage output of the DV voltage converter 119. Hence, the amplifier output power sensor 120 is coupled to the power amplifier 102 to thereby sense variation in a power output value of the power amplifier 102. The amplifier output power sensor 120 also includes a series coupled combination of resistors R4 and R5, where the resistor R5 is directly coupled to a non-inverting input of an Operational amplifier OA1 and resistor R4 is directly coupled to input 121. Also, there is a resistor R6 coupling input 122 to an inverting input of the Operational amplifier OA1.

The amplifier output power sensor 120 further includes a bipolar transistor TR with a base electrode coupled to an output of the Operational amplifier OA1, a collector electrode coupled to a common node of the series coupled combination of a resistors R4 and R5. Further, an emitter electrode of the bipolar transistor TR is coupled directly to the power variation detector output 135 (VDet) and the emitter electrode is also coupled to ground by a resistor R3. A power variation detector output 135 (VDet) of the amplifier output power sensor 120 is coupled to the reference input (Vset) of the feedback circuit 110, through the linear amplifier 140, to thereby vary the a reference voltage at the reference input (Vset) depending on the power output f the power amplifier 102.

The power amplifier gain controller 150 in this embodiment is an integrator having an integrator output 153, a gain controller input 151 coupled to the power variation detector output 135 (VDet) and the second input 152 that is coupled to the gain controller voltage reference output 149. The power amplifier gain controller 150 includes resistor R1 coupling the gain controller input 151 to an inverting input of an Operational amplifier OA2. A non-inverting input of the operational amplifier OA2 is coupled to the second input 152 and a parallel coupled resistor capacitor network of a capacitor C1 and resistor R2 provides a feedback from the integrator output 153 to the inverting input of Operational amplifier OA2. The integrator output 153 is coupled to a power amplifier gain control input 113 of the power amplifier 102 to thereby, in use, control the gain of the power amplifier 102.

The radio frequency power amplifier circuit 100 also includes switching circuitry 134 having a first switching circuitry output 136 that is coupled to an enabling input (ENB) of the logarithmic amplifier 132 and a second switching circuitry output 137 coupled to supply inputs of the Operational amplifiers OA1, OA2. The gain buffer circuitry 111 of the feedback circuit 110 comprises an Operational amplifier OA4 with a feedback resistor R10 coupled between an output and inverting input of Operational amplifiers OA4. The output of the Operational amplifier OA4 is coupled to the driver gain control input 112. Also, a resistor R11 couples the inverting input to ground and a non-inverting input of Operational amplifiers OA4 is coupled through a resistor $R_{APC}$ to the direct current output ($V_{APC}$) of the logarithmic amplifier 132. A regulator 144 coupled to the supply voltage power source 117 typically provides a regulated 5 Volts direct current power supply to a Power supply input (VPOS) of the logarithmic amplifier 132. A ceramic decoupling capacitor $C_{POS}$ connects the Power supply input (VPOS) to ground an a series capacitor $C_{FLT}$ and resistor $R_{FLT}$ circuit couples a filter input (FLTR) to ground for determining time domain response characteristics of the feedback circuit 110.

Also illustrated is a controller 160, typically a microprocessor, having control outputs coupled to control inputs of the voltage reference control circuit 126, switching circuitry 134, regulator 144 and DC voltage converter 119. This controller 160 is usually coupled to a user interface (not shown) for receiving user command signals, transmission request commands and power mode requests for driving the power amplifier 102.

Figure 2:
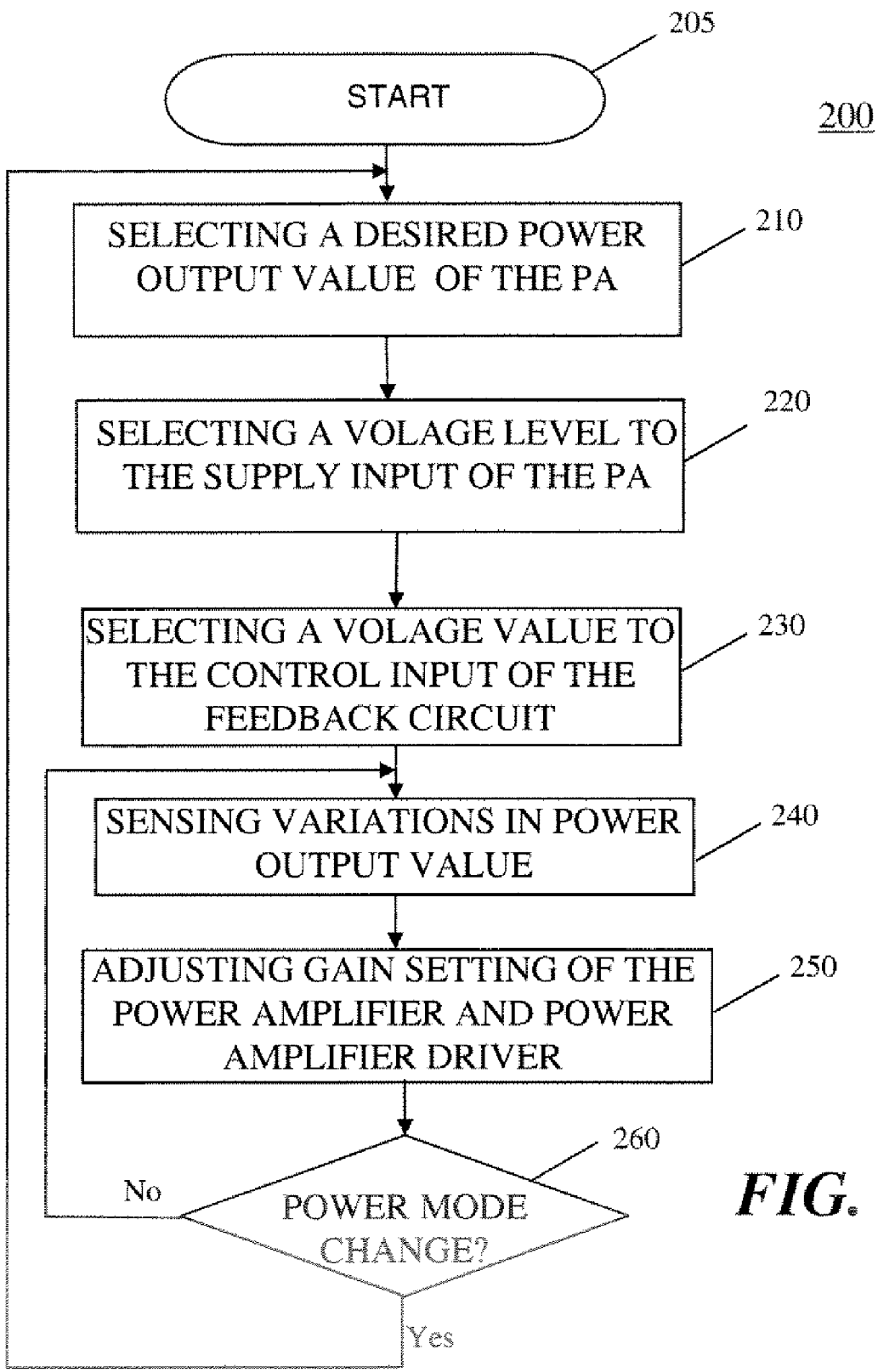
FIG. 2 illustrates a method for adjusting gain settings, the method being performed by the frequency power amplifier circuit of FIG. 1.

In operation, the radio frequency power amplifier circuit 100 operates as a constant envelope modulated radio frequency amplifier as illustrated by the method 200 of FIG. 2. The method 200 provides for adjusting a gain setting of the power amplifier 102 and power amplifier driver 106 and at a block 205, the method 200 is typically initiated by a request from a user, via controller 160, to transmit a radio frequency signal in which the radio frequency power amplifier circuit 100 is required to amplify a constant envelope modulated radio frequency signal provided by the constant enveloped modulation providing circuitry 104. At block 210 there is provided selecting a power output value of the power amplifier 102 and the associated constant envelope modulated radio frequency signal value supplied by the power amplifier driver 106 to the power amplifier 102. Thereafter, in order for the radio frequency power amplifier circuit 100 to operate a block 220 performs selecting a voltage level, provided to the supply input 125 of power amplifier 102. This voltage level is dependent on the desired power output value and it is determined by the DC voltage converter 119 receiving a power mode request (e.g. high power or low power) transmission requirement from the controller 160. Typically this voltage level is also provided to the supply input 127 of the power amplifier driver 106 and the switching circuit may suitably provide a supply voltage of about 5 volts to the enabling input (ENB) of the logarithmic amplifier 132 and supply inputs of Operation Amplifier OA1 and OA2. In addition, the regulator 144, controlled by the controller 160 provides a supply voltage of about 5 volts to the Power supply input (VPOS) of the logarithmic amplifier 132.

In response to the power mode request, at block 230, the DC voltage converter 119 sends a control voltage to the voltage reference control circuit 126 thereby selecting a voltage value that is processed by linear amplifier 140 to supply a reference voltage value at the reference input (Vset) of the feedback circuit 110. This voltage value supplied to the reference input (Vset) is dependent on the desired power output value (POV). Also, the voltage reference control circuit 126 provides a reference input 152 of the power amplifier gain controller 150 to control the voltage to the power amplifier gain control input 113 of the power amplifier 102.

In response to the above there is an operation ramp up of the radio frequency power amplifier circuit 100 in which a bias voltage is provided from output of the Operation Amplifier OA1 of feedback circuit 110 to the driver gain control input 112. Also, a radio frequency output signal from the signal sensor output 109 of the amplifier input signal sensor 108 is provided to the radio frequency signal input (RFIN) of the feedback circuit 110. This radio frequency output signal is proportional to an amplitude of a constant envelope modulated radio frequency signal generated from constant envelope modulation providing circuitry 104 and supplied (amplified) from the power amplifier driver 106. The radio frequency power amplifier circuit 100 thus operates to provide a gain setting to the driver gain control input 112 of the power amplifier driver 106, wherein this gain setting has a voltage value dependent on the radio frequency output signal amplifier signal sensor output 109 and the voltage value provided at the reference input (Vset).

Also in response to the above the power amplifier gain controller 150 provides a gain setting to the power amplifier gain control input 113. It should be noted, as will be apparent to a person skilled in the art, that both the gain setting to the power amplifier gain control input 113 and the gain setting to the driver gain control input 112 are dependent on the a power output value (POV) of the power amplifier 102. Hence, at a block 240, the method 200 performs sensing variations in the power output value (POV) of the power amplifier 102 and thereafter at a block 250, in response to the sensing, performs both adjusting the gain setting of the power amplifier 102 and the gain setting of the power amplifier driver 106 so that the constant envelope modulated signal is within a linear operating region of the power amplifier 102. At block 250, the gain settings of the power amplifier 102 and power amplifier driver 106 are concurrently adjusted until the power output value (POV) for the power amplifier 102 is achieved. More specifically, when there is an increase in the gain setting of the power amplifier 102 the gain setting of the power amplifier driver 106 is decreased. Conversely, when there is a decrease in the gain setting of the power amplifier 102 the gain setting of the power amplifier 106 is increased.

The method 200 then determines, at test block 260, if a power mode change request from has bene received from controller 160. If there is no change in power mode requested the method 200 continuously repeats blocks 240, 250 and 260. However, if a there is a change in power mode requested the method goes to block 210. As will be apparent to a person skilled in the art, the method 200 terminates when the controller 160 provides an end of transmission request.

From the above it will be apparent that the method 200 provides for continuously adjusting a gain settings of a power amplifier and a gain setting of a power amplifier driver so that when variations in the power output value (POV) are sensed (due for instance due to load variations or supply voltage variation). The gain setting of a power amplifier driver is thus determined by the voltage value at the direct current output (Vapc) of logarithmic amplifier 132 that is controlled by comparing the voltage value at the reference input (Vset) with the radio frequency output signal. More specifically, he gain setting of the power amplifier driver 106 is has a value dependent on a) supplying a control voltage value at the reference input (Vset) of the feedback circuit 110, this control voltage value being dependent on the sensing variations in the power output value provided the power variation detector output 135; and b) providing a radio frequency output signal at the amplifier signal sensor output 108 that is proportional to an amplitude of a constant envelope modulated radio frequency signal supplied from the power amplifier driver 106.

Hence, the feedback circuit 110 varies the driver gain control input 112 to maintain the amplitude of a constant envelope modulated radio frequency signal at a specific value for the gain setting of the power amplifier 102 so that the constant envelope modulated radio frequency signal provided to the power amplifier 102 from the power amplifier driver 106 is within a linear operating region of the power amplifier 102. In this regard to improve to efficiency of the radio frequency power amplifier circuit 100, specifically the power amplifier 102, the voltage value provided at reference input (Vset) is dependent upon the power output value of the power amplifier 102.

Figure 3:
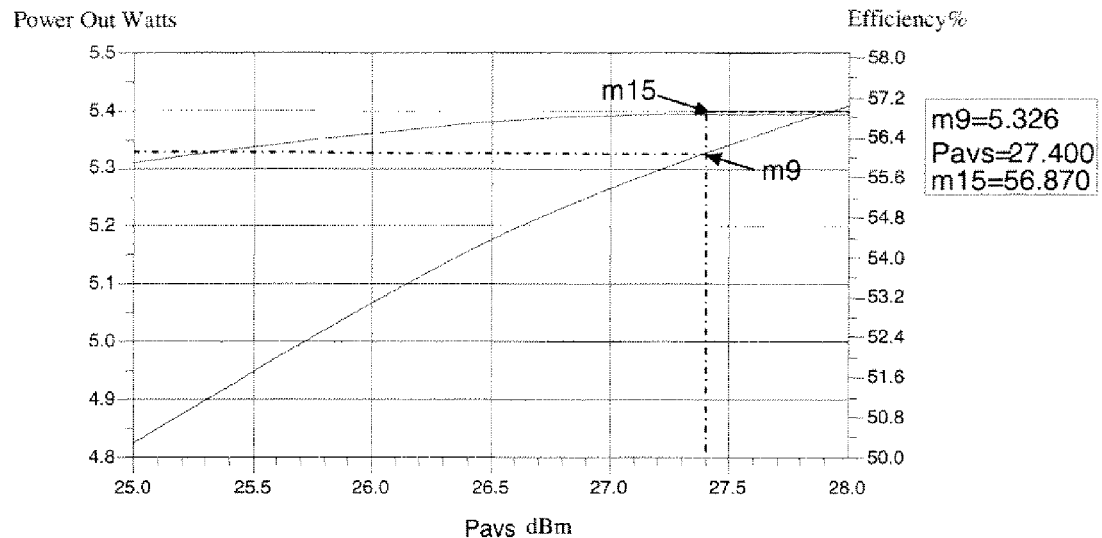
FIG. 3 shows graphically simulation results of efficiency versus RF drive at 7.2 V supply voltage for the frequency power amplifier circuit of FIG. 1.

Simulations of the power amplifier circuit 100 show a substantially constant efficiency across the power level with an RF drive (feedback provided by the feedback circuitry) and drain supply adjustment (selecting the voltage level at the supply input of the power amplifier). Referring to FIG. 3, there is illustrated graphically simulation results of efficiency versus RF drive at 7.2 V supply voltage for the radio frequency power amplifier circuit 100. These results are for the high power mode of 5.326 Watts requiring a 7.2 V supply voltage to the supply input 125. For the 7.2 V supply voltage, this high power mode of 5.326 Watts (m9) has a maximum efficiency of 56.87% (m15) when a constant envelope modulated radio frequency signal at the amplifier input 118 has amplitude (Pavs) of 27.4 dBm.

Figure 4:
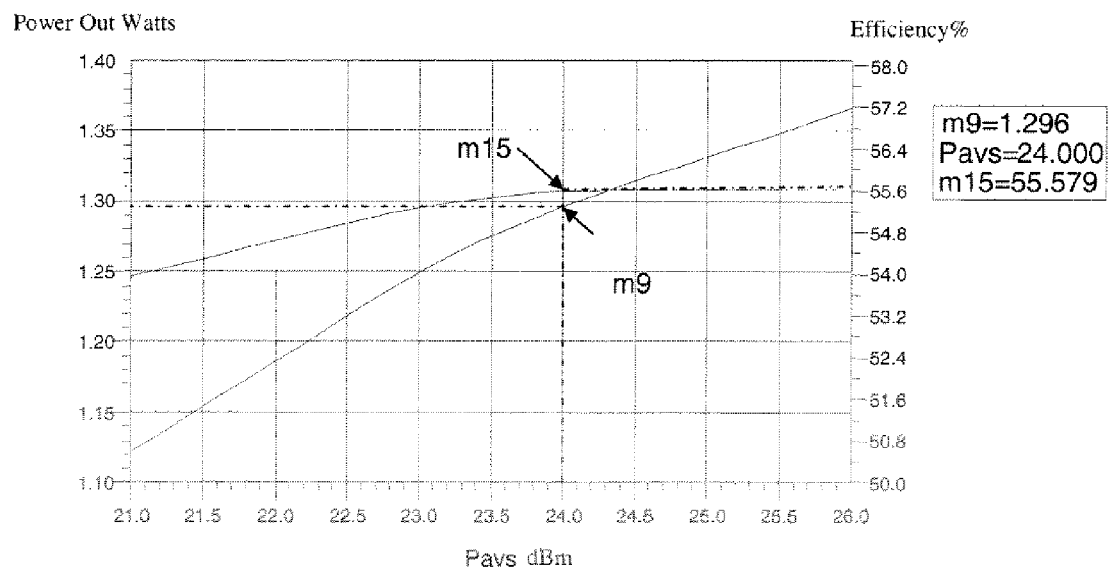
FIG. 4 shows graphically simulation results of efficiency versus RF drive at 3.6 V supply voltage for the frequency power amplifier circuit of FIG. 1.

Referring to FIG. 4, again there is illustrated graphically simulation results of efficiency versus RF drive at 7.2 V supply voltage for the radio frequency power amplifier circuit 100. These results are for the low power mode of 1.296 Watts requiring a 3.6 V supply voltage to the supply input 125. For the 3.6 V supply voltage, this low power mode of 1.296 Watts (m9) has a maximum efficiency of 55.579% (m15) when a constant envelope modulated radio frequency signal at the amplifier input 118 has amplitude (Pavs) of 24 dBm.

The values identified in FIGS. 3 and are 4 are used in the method 200 to obtain an efficient operation of the power amplifier 102. Also, as described above, the change in the voltage value at the reference control output 128 provides a change to the reference input (Vset) of the feedback circuit 110. Therefore adjustment of voltage values at the reference input (Vset) changes the gain of the power amplifier driver, thereby adjusting the RF drive to the power amplifier 102. The measurement results of efficiency across various power levels is shown in table 1. The data shows that constant efficiency can be achieved across various power levels (0.5 W-6.5 W) or power modes (e.g. very high, high, medium, low, very low).

TABLE 1

Measurement results of efficiency across power level

| Vds (V) | Vset (V) | Vgs driver (V) | Pwr (W) | Pwr (dBm) | Driver I (A) | PA I (A) | Drain Eff (%) | PAE (%) |
|---|---|---|---|---|---|---|---|---|
| 2.4 | 0.78 | 1.74 | 0.5 | 27.1 | 0.06 | 0.41 | 45.2 | 43.8 |
| 3.6 | 0.81 | 1.79 | 1.3 | 31.1 | 0.08 | 0.72 | 45.1 | 44.6 |
| 4.4 | 0.85 | 1.87 | 2 | 33 | 0.09 | 0.93 | 44.6 | 44.2 |
| 5.4 | 0.88 | 1.92 | 3 | 34.8 | 0.1 | 1.13 | 45.2 | 44.9 |
| 6.6 | 0.92 | 1.99 | 4.5 | 36.5 | 0.12 | 1.39 | 45.2 | 45 |
| 7.2 | 0.97 | 2.07 | 5.3 | 37.2 | 0.13 | 1.51 | 44.9 | 44.8 |
| 8 | 0.99 | 2.12 | 6.5 | 38.1 | 0.14 | 1.68 | 44.6 | 44.5 |

Advantageously, the present invention provides for substantially maintaining a pre-defined amplitude of a constant envelope modulated radio frequency signal at an amplifier input 118 wherein the gain of the power amplifier driver 106 is continuously adjusted to provide efficient operation in the linear operating region of the power amplifier 102. As a result, power consumption is reduced therefore increasing operation time of the radian frequency power amplifier circuit 100 between charging of the supply voltage power source 117 (the supply typically being a battery pack). Accordingly, the present invention provides for a radio frequency power amplifier circuit 100 wherein, in operation, when the amplifier output power sensor 120 senses the variations in the power output value, the power amplifier gain controller 150 adjusts the gain setting of the power amplifier 102 at the power amplifier gain control input 113 and the feedback circuit 110 adjusts a gain setting of the driver gain control input 112 so that the constant envelope modulated signal is within a linear operating region of the power amplifier, and wherein the gain settings of the power amplifier 102 and power amplifier driver 106 are concurrently adjusted until the power output value for the power amplifier is achieved.

It will be appreciated that embodiments of the invention described herein may be comprised of one or more conventional processors and unique stored program instructions that control the one or more processors to implement, in conjunction with certain non-processor circuits, some, most, or all of the functions of the radio frequency power amplifier circuit described herein. The non-processor circuits may include, but are not limited to, a radio receiver, a radio transmitter, signal drivers, clock circuits, power source circuits, and user input devices. As such, these functions may be interpreted as steps of a method to substantially maintain the RF amplified signal at a constant predefined amplitude. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

In the foregoing specification, a specific embodiment of the present invention have been described. However, one of ordinary skill in the art appreciates that various modifications and changes can be made without departing from the scope of the present invention as set forth in the claims below. For example, the amplifier output senor 120 could be in the form of a coupler similar to the amplifier input signal sensor 108, the coupler being connected to at the output of the power amplifier and provides a processed direct current signal to the linear amplifier 140 and power amplifier gain controller 150. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the tendency of this application and all equivalents of those claims.

We claim:

1. A radio frequency power amplifier circuit comprising:
   a constant envelope modulation providing circuitry;
   a power amplifier driver having a driver gain control input, a driver signal output, and a driver signal input coupled to the constant envelope modulation providing circuitry;
   a power amplifier having an amplifier input coupled to the driver signal output;
   an amplifier input signal sensor having an amplifier signal sensor output;
   an amplifier output power sensor coupled to the power amplifier to thereby sense variations in a power output value of the power amplifier;
   a power amplifier gain controller having a gain controller input coupled to a power variation detector output of the amplifier output power sensor and an output of the power amplifier gain controller is coupled to a power amplifier gain control input of the power amplifier; and
   a feedback circuit having an Radio Frequency signal input coupled to the amplifier signal sensor output, a reference input coupled to the power variation detector output of the amplifier output power sensor, and a feedback circuit output coupled to the driver gain control input,
   wherein, in operation, when the amplifier output power sensor senses the variations in the power output value, the power amplifier gain controller adjusts a gain setting of the power amplifier at the power amplifier gain control input and the feedback circuit adjusts a gain setting of the driver gain control input so that the constant envelope modulated radio frequency signal is within a linear operating region of the power amplifier, and wherein the gain settings of the power amplifier and power amplifier driver are concurrently adjusted until the power output value for the power amplifier is achieved.

2. A radio frequency power amplifier circuit as claimed in claim 1, wherein said feedback circuit compares the voltage value provided at the reference input with a voltage value resulting from the Radio Frequency signal input to provide the a voltage that provides the gain setting of the driver gain control input.

3. The radio frequency power amplifier circuit as claimed in claim 2, wherein said feedback circuit includes a logarithmic amplifier.

4. The radio frequency power amplifier circuit as claimed in claim 1, wherein the constant envelope modulation providing circuitry is from a set including Frequency modulation circuitry and frequency shift key modulation circuitry.

5. The radio frequency power amplifier circuit as claimed in claim 1 wherein, in operation, when there is an increase in the gain setting of the power amplifier and the gain setting of the power amplifier driver is decreased.

6. The radio frequency power amplifier circuit as claimed in claim 1 wherein, in operation, when there is an decrease in the gain setting of the power amplifier the gain setting of the power amplifier driver is increased.

7. A method for adjusting a gain setting of a power amplifier and a gain setting of a power amplifier driver that form part of a constant envelope modulated radio frequency amplifier, the method comprising:
- selecting a power output value for the power amplifier and an associated constant envelope modulated radio frequency signal supplied by the power amplifier driver to the power amplifier;
- sensing variations in a power output value of the power amplifier;
- adjusting the gain setting of the power amplifier in response to the sensing; and
- adjusting the gain setting to the power amplifier driver in response to the sensing so that the constant envelope modulated radio frequency signal is within a linear operating region of the power amplifier,
- wherein the gain settings of the power amplifier and power amplifier driver are concurrently adjusted until the power output value for the power amplifier is achieved.

8. The method for adjusting a gain setting as claimed in claim 7, wherein when there is an increase in the gain setting of the power amplifier the gain setting of the power amplifier driver is decreased.

9. The method for adjusting a gain setting as claimed in claim 7, wherein when there is a decrease in the gain setting of the power amplifier the gain setting of the power amplifier driver is increased.

10. The method for adjusting a gain setting as claimed in claim 7, wherein the adjusting the gain setting of the power amplifier driver is further characterized by being dependent on:
- supplying a control voltage value at a reference input of a feedback circuit of the radio frequency amplifier, the control voltage value being dependent on the sensing variations in the power output value;
- providing a radio frequency output signal that is proportional to an amplitude of a constant envelope modulated radio frequency signal supplied from the power amplifier driver; and
- providing the gain setting of the power amplifier driver, the gain setting of the power amplifier driver having a value dependent on the radio frequency output signal and voltage value provided at the reference input.

11. The method for adjusting a gain setting as claimed in claim 10, wherein the gain setting of the power amplifier driver is provided by a circuitry including a logarithmic amplifier.

12. The method for adjusting a gain setting as claimed in claim 10, wherein the gain setting of the power amplifier driver is provided by the control voltage value provided at the reference input being compared with a voltage value resulting from the radio frequency output signal.

13. The method for adjusting a gain setting as claimed in claim 7, wherein said constant envelope modulated radio frequency signal is a frequency modulated signal.

14. The method for adjusting a gain setting as claimed in claim 7, wherein said constant envelope modulated radio frequency signal is a frequency shift key modulated signal.

15. The method for adjusting a gain setting as claimed in claim 7, wherein there is a prior step of selecting a voltage level provided to a supply input of the power amplifier.

* * * * *